(12) United States Patent
Hsiao et al.

(10) Patent No.: US 9,216,469 B2
(45) Date of Patent: Dec. 22, 2015

(54) INDIRECT PRINTING BUMPING METHOD FOR SOLDER BALL DEPOSITION

(71) Applicant: Taiwan Semiconductor Manufacturing Co., Ltd., Hsin-Chu (TW)

(72) Inventors: Yi-Li Hsiao, Hsinchu (TW); Da-Yuan Shih, Hsinchu (TW); Chih-Hang Tung, Hsinchu (TW); Chen-Hua Yu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 65 days.

(21) Appl. No.: 14/057,117

(22) Filed: Oct. 18, 2013

(65) Prior Publication Data

US 2015/0108206 A1 Apr. 23, 2015

(51) Int. Cl.
*B23K 37/00* (2006.01)
*B23K 3/06* (2006.01)
*B23K 1/20* (2006.01)

(52) U.S. Cl.
CPC .............. *B23K 3/0638* (2013.01); *B23K 1/20* (2013.01); *B23K 2201/40* (2013.01)

(58) Field of Classification Search
None
See application file for complete search history.

(56) References Cited

U.S. PATENT DOCUMENTS

| | | | | |
|---|---|---|---|---|
| 3,152,428 A | * | 10/1964 | Hill | 53/493 |
| 4,597,420 A | * | 7/1986 | Schoenthaler et al. | 141/2 |
| 4,622,239 A | * | 11/1986 | Schoenthaler et al. | 427/8 |
| 4,704,305 A | * | 11/1987 | Berger et al. | 427/98.4 |
| 5,577,657 A | * | 11/1996 | Glovatsky | 228/180.1 |
| 5,778,964 A | * | 7/1998 | Kawaguchi et al. | 164/271 |
| 5,887,345 A | * | 3/1999 | Kulesza et al. | 29/852 |
| 5,909,839 A | * | 6/1999 | Belke et al. | 228/248.1 |
| 6,267,266 B1 | * | 7/2001 | Smith et al. | 222/1 |
| 6,276,599 B1 | * | 8/2001 | Ogawa | 228/254 |
| 6,352,189 B1 | * | 3/2002 | Kobayashi | 228/8 |
| 6,454,154 B1 | * | 9/2002 | Pedigo | 228/33 |
| 6,460,755 B1 | * | 10/2002 | Inoue et al. | 228/246 |
| 2002/0017715 A1 | * | 2/2002 | Giacomo et al. | 257/712 |

(Continued)

FOREIGN PATENT DOCUMENTS

| | | | | |
|---|---|---|---|---|
| EP | 259102 A2 | * | 3/1988 | H05K 3/34 |
| JP | 63303681 A | * | 12/1988 | B23K 3/06 |

OTHER PUBLICATIONS

Anadigics, Inc. "Solder Reflow Report." Published Jan. 2002. 8 Pages.

(Continued)

*Primary Examiner* — Kiley Stoner
(74) *Attorney, Agent, or Firm* — Eschweiler & Associates, LLC (57) ABSTRACT

Some embodiments of the present disclosure relate to an apparatus and method to form a pattern of solder bumps. A solder paste is applied a plate comprising a pattern of holes, where each hole is partially filled by a piston attached to a movable stage. The remainder of the holes are filled by applying a force to the solder paste with a first solder paste application tool. A second solder paste application tool then removes excess paste from the front surface of the plate. The solder paste is then disposed onto a surface of a substrate by moving the movable stage, which fills a larger portion of each hole with a piston, forces the solder paste out of each hole, and forms pattern of solder paste on the surface of the substrate. The pattern of solder paste is then subjected to additional processing to form a pattern of solder bumps.

20 Claims, 8 Drawing Sheets

(56) References Cited

U.S. PATENT DOCUMENTS

| | | |
|---|---|---|
| 2002/0034582 A1* | 3/2002 | Eldridge .................... 427/96 |
| 2002/0038814 A1* | 4/2002 | Mimura et al. ............... 228/256 |
| 2003/0178466 A1* | 9/2003 | Lin et al. .................... 228/21 |
| 2004/0094601 A1* | 5/2004 | Hazeyama et al. ............ 228/41 |
| 2004/0108368 A1* | 6/2004 | Onishi et al. ............... 228/248.1 |
| 2004/0214420 A1* | 10/2004 | Brouillette et al. ........... 438/616 |
| 2006/0134903 A1* | 6/2006 | Boufnichel et al. ........... 438/614 |
| 2006/0183270 A1* | 8/2006 | Humpston .................... 438/106 |
| 2008/0230587 A1* | 9/2008 | Yang ........................... 228/165 |
| 2008/0237315 A1* | 10/2008 | Gormley et al. .............. 228/246 |
| 2009/0020591 A1* | 1/2009 | Sakaguchi ................. 228/180.22 |
| 2009/0093111 A1* | 4/2009 | Buchwalter et al. .......... 438/614 |
| 2010/0230472 A1* | 9/2010 | Okamoto et al. ............. 228/104 |
| 2010/0288818 A1* | 11/2010 | Kim et al. .................... 228/41 |
| 2011/0049759 A1* | 3/2011 | Garant et al. ................ 264/259 |
| 2012/0318855 A1* | 12/2012 | McLeod et al. ............... 228/203 |
| 2013/0199386 A1* | 8/2013 | Lynch et al. ................. 101/123 |
| 2014/0102322 A1* | 4/2014 | Tomomatsu et al. .......... 101/123 |
| 2014/0150929 A1* | 6/2014 | Sandstrom ..................... 148/24 |
| 2014/0301042 A1* | 10/2014 | Stella et al. .................. 361/709 |

OTHER PUBLICATIONS

Ishikawa, et al. "Lead-Free Solder Micro-Ball Bumps for the Next Generation of Flip Chip Interconnection: Micro-Ball Materials, Bump Formation Process and Reliability." IEEE Electronic Components and Technology Conference. Published in 2007.

Sylvester, Jessica. "Flux-Less Micro BGA Solder Reflow." Palomar Technologies. Apr. 13, 2011.

Wakiyama, et al. "Novel Low-Temperature CoC Interconnection Technology for Multichip LSI (MCL)." IEEE Electronic Components and Technology Conference. Published in 2007.

\* cited by examiner

INDIRECT PRINTING BUMPING METHOD FOR SOLDER BALL DEPOSITION

BACKGROUND

The following disclosure relates to a tool and method to achieve mass production for fine pitch solder bumps suitable for packaging interconnections in 2.5D and 3D integrated circuit (IC) applications.

DETAILED DESCRIPTION

The description herein is made with reference to the drawings, where like reference numerals are generally utilized to refer to like elements throughout, and where the various structures are not necessarily drawn to scale. In the following description, for purposes of explanation, numerous specific details are set forth in order to facilitate understanding. It is evident, however, that one or more aspects described herein may be practiced with a lesser degree of these specific details. In other instances, known structures and devices are shown in block diagram form to facilitate understanding.

Mass production for fine pitch solder bumps is utilized in such applications as memory-stacking for increased memory density and memory-on-logic stacking for 3D applications, logic and memory stacking on an interposer for 2.5D applications, or in more traditional applications such as Flip Chip Ball Grid Arrays (FCBGAs) or Fan Out Wafer Level Packages (FOWLPs), among others. The ever-increasing demand for 2.5D and 3D integrated chip (ICs) drives a demand for a low-cost micro-bump process, which includes a uniform solder bump size and composition within a pattern of solder bumps, as well as a sufficient space between adjacent solder bumps to avoid bridging and hence shorts, even as the size and space of solder bump arrays scale to keep pace of Moore's Law scaling on IC components.

Accordingly, some embodiments of the present disclosure relate to an apparatus and method to form a pattern of solder bumps. A solder paste is applied a plate comprising a pattern of holes, where each hole is partially filled by a piston attached to a movable stage. The remainder of the holes are filled by applying a force to the solder paste with a solder paste application tool, which pushes the paste into the holes. The solder paste application tool then removes excess paste from the front surface of the plate. The solder paste is then disposed onto a surface of a substrate by moving the movable stage, which fills a larger portion of each hole with a piston, forces the solder paste out of each hole, and forms pattern of solder paste on the surface of the substrate. The pattern of solder paste is then subjected to additional processing to form a pattern of solder bumps. The methods and apparatuses disclosed herein avoid drawbacks of some prior art approaches such as plating or direct solder paste deposition, which include a photoresist deposition, patterning, and etch to form, as well as plating and striping processes for solder bump formation.

Figure 1A:
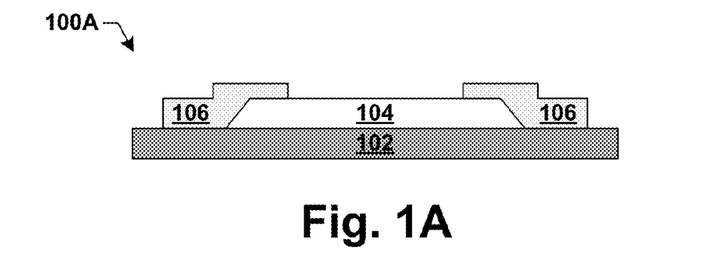
FIGS. 1A-1C illustrate cross-sectional views of some embodiments of solder bump deposition.
Figure 1B:
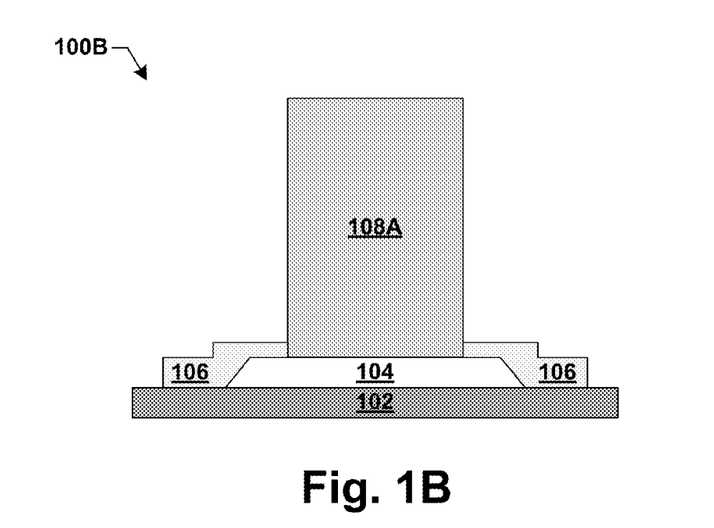
Figure 1C:
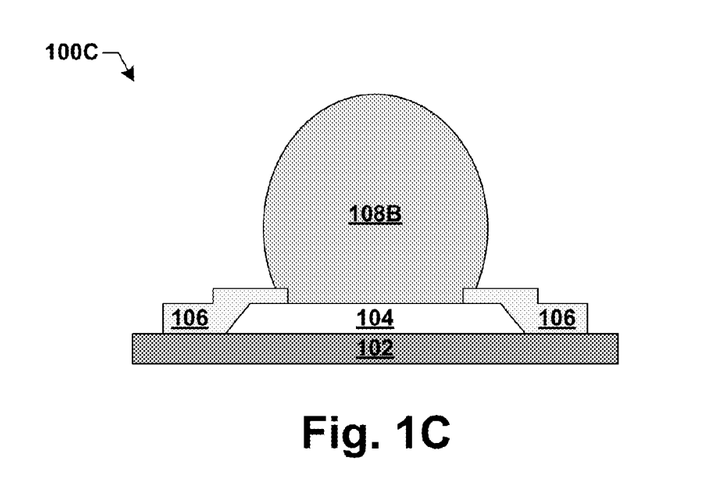

FIGS. 1A-1C illustrate cross-sectional views of some embodiments of solder bump deposition. FIG. 1A illustrates a cross-sectional view 100A of a top surface of a substrate 102, whereupon an under-bump metal (UBM) 104 is disposed, and opened through a passivation layer 106. In some embodiments, the UBM 104 comprises copper (Cu), aluminum (Al), nickel (Ni), titanium (Ti), combinations thereof, or other suitable conductor. In some embodiments, the passivation layer comprises a dielectric material such as a oxide, nitride, etc.

FIG. 1B illustrates a cross-sectional view 100B of the substrate 102, whereupon a solder paste 108A has been disposed by a method and apparatus in accordance with some embodiments of the present disclosure. In some embodiments, the solder paste 108A comprises an alloy of antimony (Sb), cadmium (Cd), indium (In), bismuth (Bi), silver (Ag), Tin (Sn), Zinc (Zn), Copper (Cu), or combinations thereof.

FIG. 1C illustrates a cross-sectional view 100C of the substrate 102, which has been subjected to a reflow with or without an optional flux step, resulting in a deformation of the solder paste 108A into a spherically-shaped solder bump 108B.

Figure 2A:
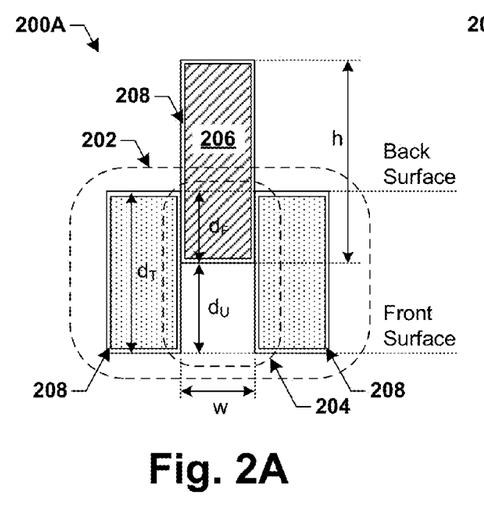
FIGS. 2A-2D illustrate cross-sectional views of some embodiments of a solder bump deposition tool.

FIG. 2A illustrates a cross-sectional view of some embodiments of a solder bump deposition tool 200A, comprising a plate 202, further comprising a hole 204, which extends from a front surface to a back surface of the plate 202. A piston 206 partially fills the hole 204 to a depth ($d_F$) of the total depth ($d_T$, also a thickness of the plate 202), such that a portion of the hole 204 remains unfilled to a depth ($d_U = d_T - d_F$). In some embodiments, the hole 204 and piston 206 comprise a width (w) of less than about 100 microns. In some embodiments, the hole 204 comprises a $d_T$ of less than about 1,000 microns. In some embodiments, the piston comprises a height (h) that is greater than $d_T$.

Figure 2B:
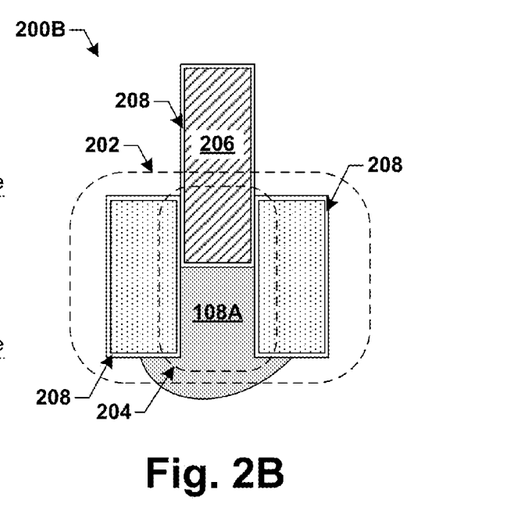

FIG. 2B illustrates a cross-sectional view of some embodiments of a solder bump deposition tool 200B, comprising the solder bump deposition tool 200A, wherein a solder paste 108A has been applied to the front surface of the plate 202, filling a remaining portion of the hole 204 that is not filled with the piston 206 with the solder paste 108A (i.e., to a depth $d_U$). In some embodiments, the sidewalls of the hole 204 and surfaces of the piston 206 are coated with a material 208 configured to minimize adhesion between the sidewalls or surfaces and the solder paste 108A. In some embodiments, the material 208 comprises a TEFLON containing material.

Figure 2C:
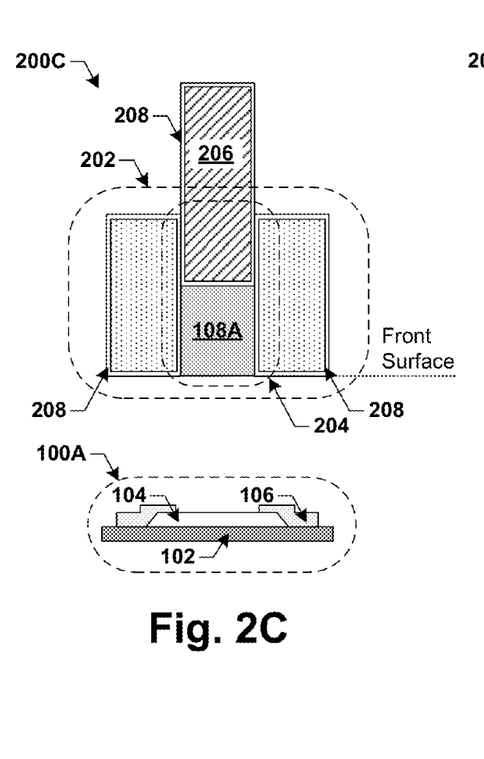

FIG. 2C illustrates a cross-sectional view of some embodiments of a solder bump deposition tool 200C, comprising the solder bump deposition tool 200B, wherein excess solder paste 108A has been removed from the front surface of the plate 202, such that the solder paste 108A filling a remaining portion of the hole 204 is substantially flush with the front surface of the plate (i.e., the front surface of the plate 202 and the solder paste 108A combine to form a substantially flat surface. The hole 204 containing the solder paste 108A has also been aligned with the opened UBM 104 on the top surface of the substrate 102.

Figure 2D:
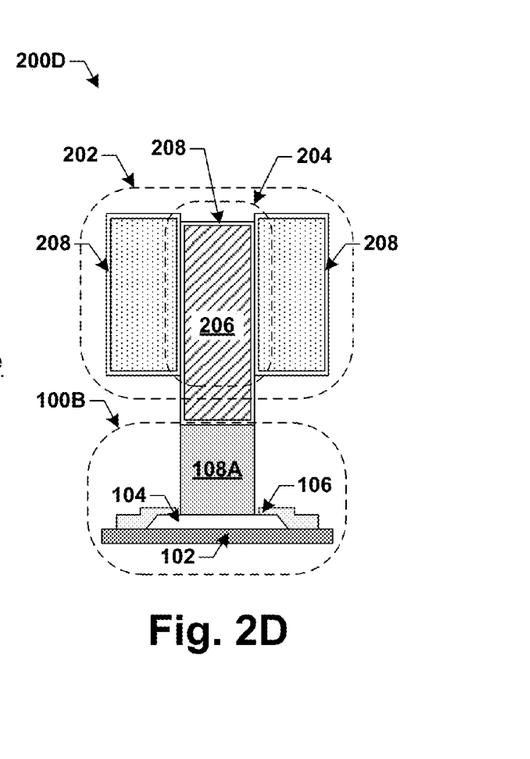

FIG. 2D illustrates a cross-sectional view of some embodiments of a solder bump deposition tool 200D, comprising the solder bump deposition tool 200C, wherein the solder paste 108A has been disposed onto the UBM 104 on the top surface of the substrate 102, by moving the piston 206A towards the plate 202, which fills the hole 204, and thusly forces the solder paste 108A out of the hole 204A. The resulting structure comprises the cross-sectional view 100B of the substrate 102, as illustrated in the embodiments of FIG. 1B.

Figure 3A:
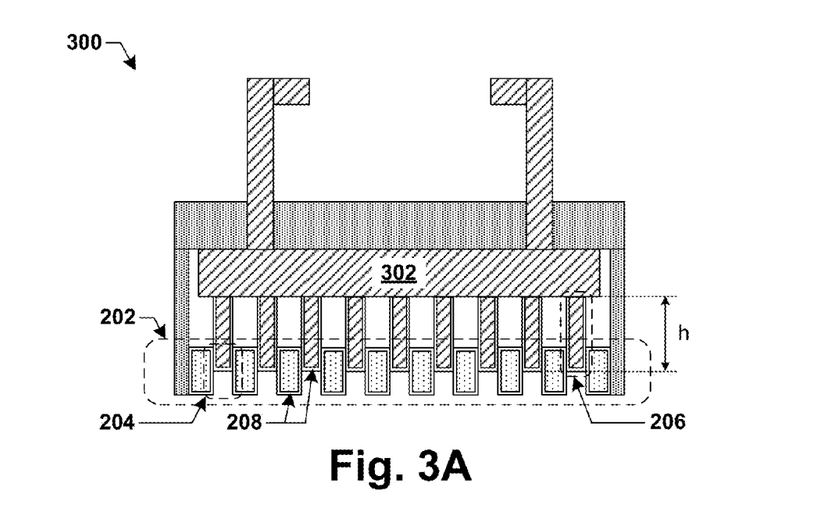
FIGS. 3A-3B illustrate some embodiments of a solder bump patterning tool.

FIG. 3A illustrates a cross-sectional view of the solder bump patterning tool 300, comprising a plate 202 comprising a plurality of holes 204, wherein a hole 204 extends from a front surface to a back surface of the plate 202. The solder bump patterning tool 300 also comprises a movable stage 302, comprising a plurality of pistons 206. The movable stage 302 is aligned to the plate 202, such that the pistons 206 partially fill the holes 204. The sidewalls of the plurality of holes 204 and surfaces of the plurality of pistons 206 are coated with a material 208 (e.g., TEFLON) configured to minimize adhesion between the sidewalls or surfaces and the solder paste (108A). The movable stage 302 is configured to move the pistons 206 along a direction, such that the pistons 206 can fill the holes 204 or leave a portion of the holes 204 empty. For the embodiments of FIG. 3A, the movable stage 302 comprises a flat front surface, and the plurality of pistons 206 comprise and equal height (h) from the flat front surface. In some embodiments, the holes 204 and pistons 206 comprise cylindrical shapes.

Figure 3B:
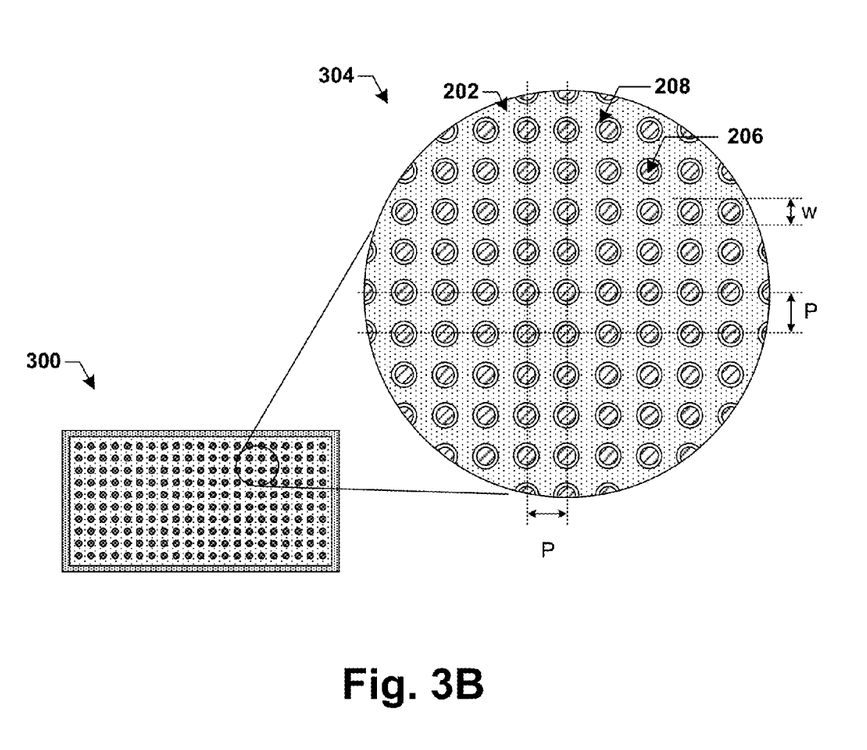

FIG. 3B illustrates a bottom-up view of the solder bump patterning tool 300. In various embodiments, a footprint of the solder bump patterning tool 300 is rectangular (as shown), circular, or another arbitrary shape. An exploded bottom-up view 304 of the solder bump patterning tool 300 is also shown. In some embodiments, the pistons 206 (equivalently the holes 204) form a pattern with a minimum pitch (P) of less than about 150 microns. In some embodiments, the (w) of the pistons 206 (equivalently the holes 204) is on a range of about 10 microns to about 1,000 microns. For the embodiments of FIG. 3B, the pattern comprises a periodic "manhattan" pattern. In various embodiments, the pattern is periodic, irregular, or random depending on the application, and may comprise a footprint of an interconnect for memory-stacking or memory-on-logic stacking for 3D applications, logic and memory stacking on an interposer for 2.5D applications, or an FCBGA or FOWLP.

Figure 4A:
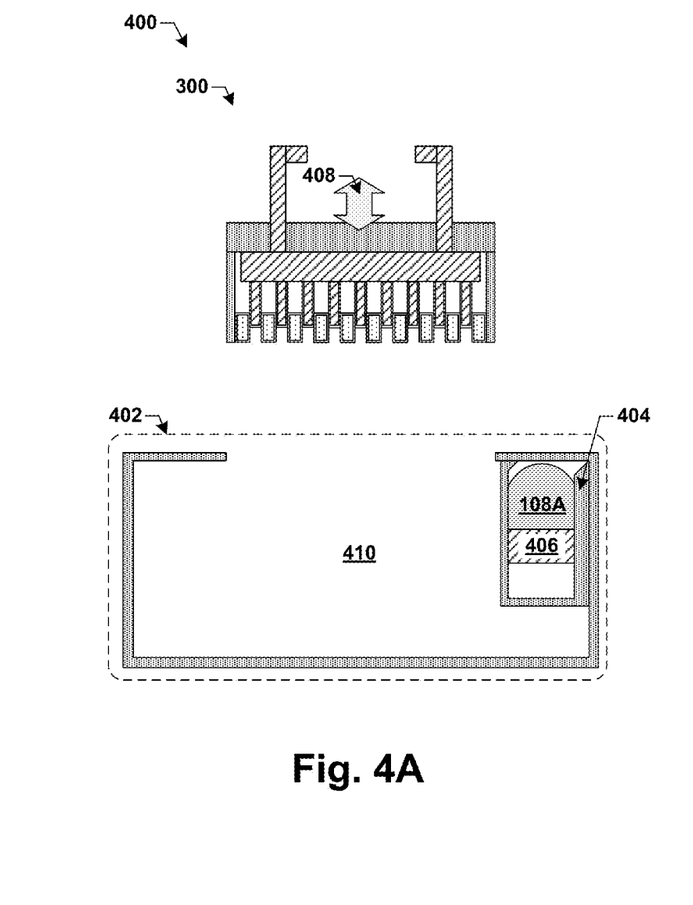
FIGS. 4A-4G illustrate cross-sectional views of a tool arrangement comprising some embodiments of a solder bump deposition tool.
Figure 4B:
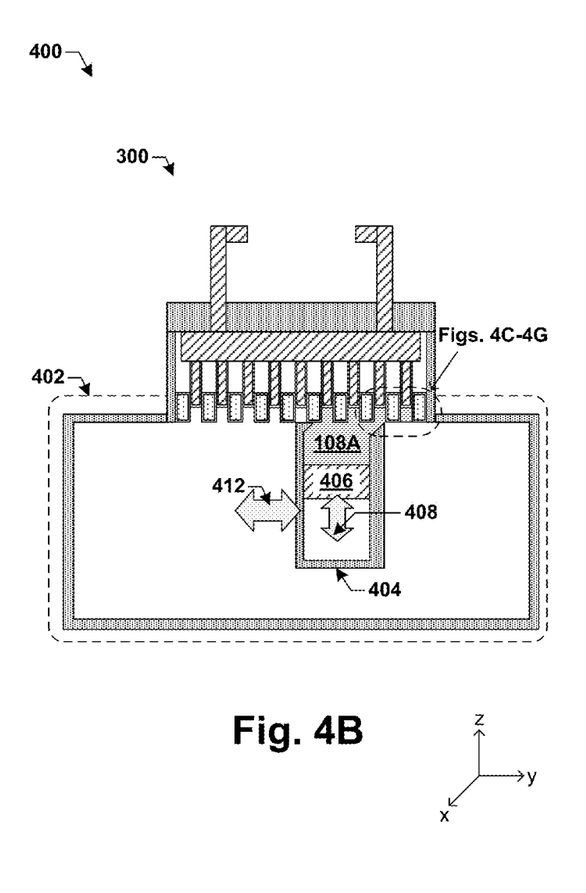

FIG. 4A illustrates a cross-sectional view of a tool arrangement 400 configured for solder bump deposition. The tool arrangement 400 comprises the solder bump patterning tool 300, and a solder paste application tool 402, comprising a solder paste dispenser 404 further comprising a piston 406. The solder bump patterning tool 300 is configured to move along a first orthogonal direction 408 (i.e., the y-direction) relative to the solder paste application tool 402, to abut a cavity 410 of the solder paste application tool 402, wherein the solder paste dispenser 404 resides, as illustrated in the cross-sectional view of the tool arrangement 400 illustrated in FIG. 4B. The solder paste dispenser 404 is configured to move in a second orthogonal direction 412 within the cavity 410, across a front surface of the plate (202) of the solder bump patterning tool 300. The piston 406 is configured to move along the first orthogonal direction 408 as the dispenser 404 moves across the front surface, which pushes the solder paste 108A into the holes (204) of the solder bump patterning tool 300.

Figure 4C:
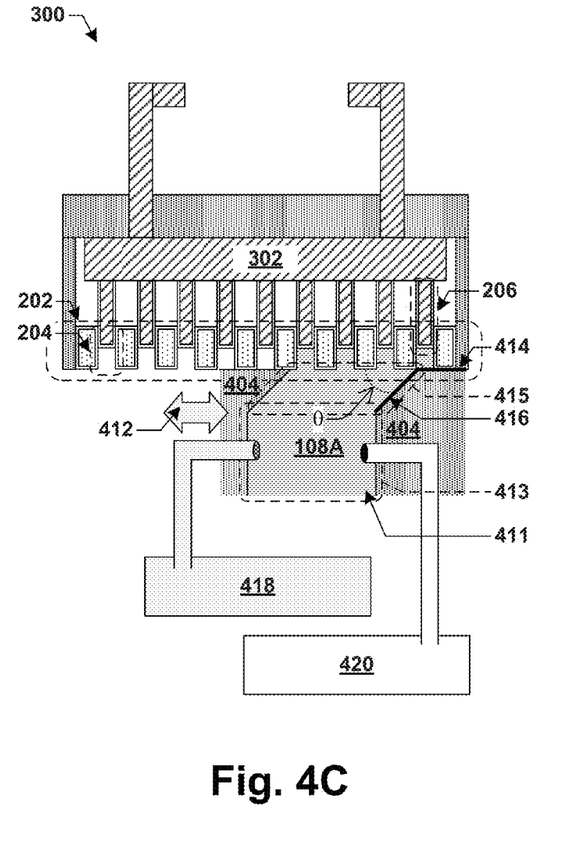

FIG. 4C illustrates a cross-sectional view of some embodiments of the solder bump patterning tool 300 within the tool arrangement 400. A first surface 414 of the dispenser 404 abuts a front surface of the plate 202, and a second surface 416 of the dispenser 404 forms an angle (8) with the front surface of the plate 202. Solder paste 108A is disposed between the front surface and the first surface 414, within a dispenser cavity 411 of the dispenser 404. The dispenser cavity 411 comprises a first region 413 extending along a first axis that is orthogonal to the front surface. Further, the dispenser cavity 411 comprises a second region 415 arranged between the first region 413 and the front surface, and extending along a second axis that is angled relative to the first axis.

Figure 4D:
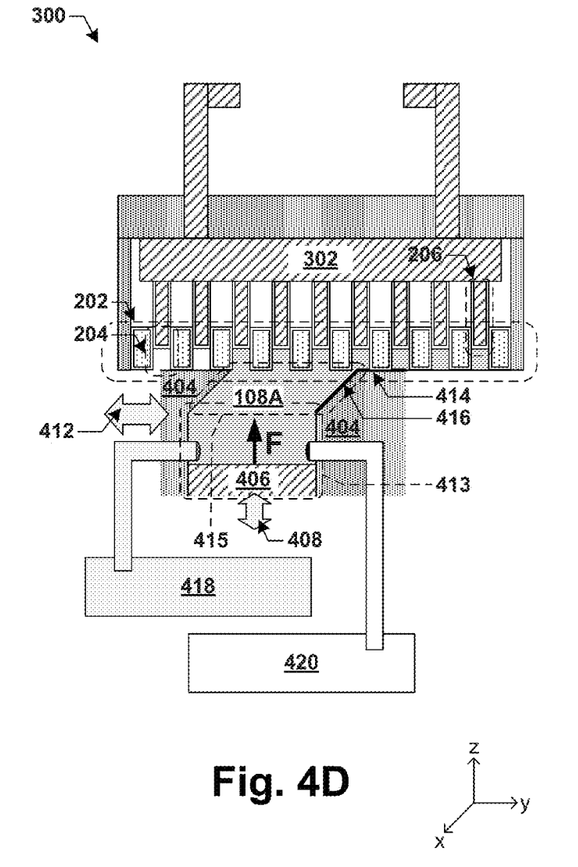

FIG. 4D illustrates a cross-sectional view of some embodiments of the solder bump patterning tool 300, wherein the dispenser 404 has moved in the second orthogonal direction 412 across the front surface of the plate (202), filling the holes 204 with solder paste 108A. Simultaneously, the piston 406 moves within the first region 413 of the dispenser cavity 411 along the first orthogonal direction 408, exerting a normal force (F) to the front surface of the plate 202 along a first orthogonal direction. The normal force (F) pushes the solder paste 108A into the holes 204 through the second region 415 of the dispenser cavity 411, filling a remaining portion of each hole 204 that is not filled with one of the plurality of pistons 206 with the solder paste 108A. The pressure exerted by the normal force (F) within a cavity comprising the portion of a hole 204 not filled by a piston 206 forces out air and other ambient particles from the cavity. A vacuum tool 418 removes the air and other ambient particles, creating a vacuum, which reduces voids within the solder paste 108A prior to deposition onto a substrate. A supply tool 420 provides the solder paste 108A to the dispenser 404.

Figure 4E:
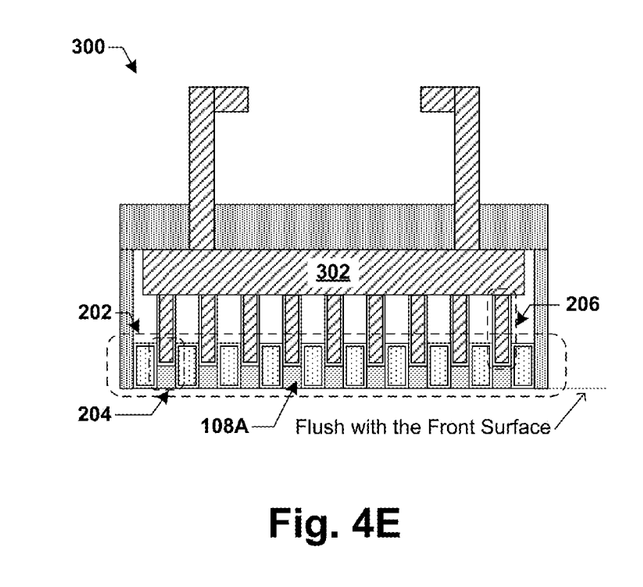

FIG. 4E illustrates a cross-sectional view of some embodiments of the solder bump patterning tool 300, which has been moved along the first orthogonal direction 408 relative to the solder paste application tool 402 after application of the solder paste 108A within the holes 204. The first and second surfaces 414, 416 of the dispenser 404 have removed excess solder paste 108A from the front surface of the plate 202, such that the solder paste 108A filling the remaining portion of each hole 204 is substantially flush with the front surface of the plate 202.

Figure 4F:
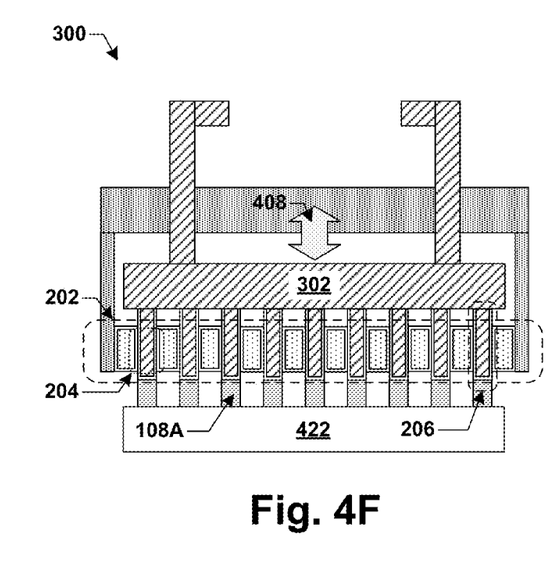
Figure 4G:
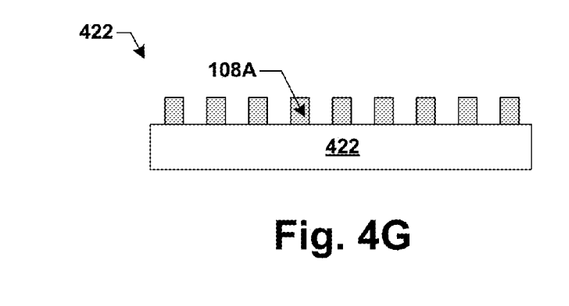

FIG. 4F illustrates a cross-sectional view of some embodiments of the solder bump patterning tool 300, wherein the movable stage 302 moves the pistons 206 along the first orthogonal direction 408 towards the plate 202. The movement causes the pistons 206 to completely fill the holes 204, forcing the solder paste 108A out of the holes 204. The expelling of the solder paste 108A from the holes 204 and onto a surface of a substrate 422 forms a pattern of solder paste 108A on the surface of the substrate 422, which corresponds to the pattern of holes 204, as illustrated in the cross-sectional view 400G of the substrate 422 in FIG. 4G.

Figure 5:
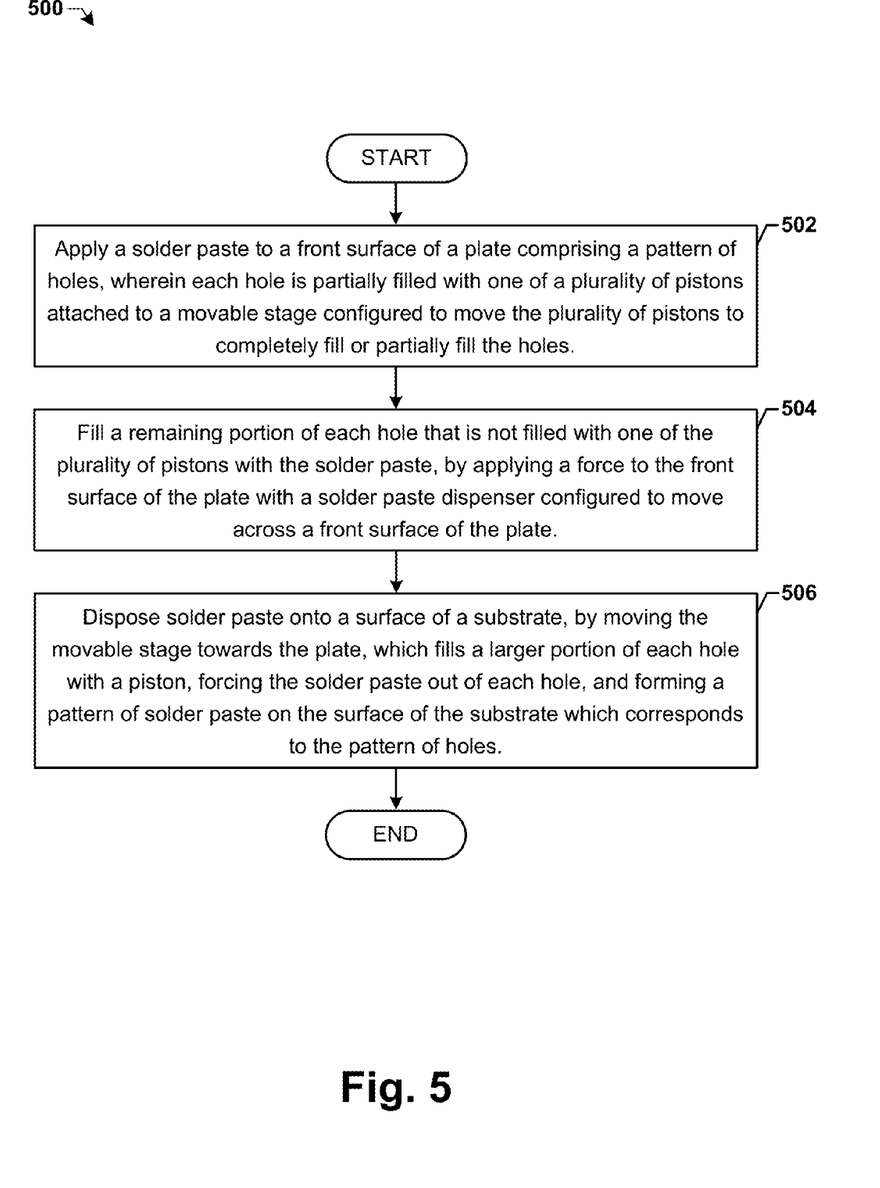
FIG. 5 illustrates some embodiments of a method of forming a pattern of solder bumps on a surface of a substrate.

FIG. 5 illustrates some embodiments of a method of forming a pattern of solder bumps on a surface of a substrate. While method 500 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 502 a solder paste is applied to a front surface of a plate comprising a pattern of holes, wherein each hole is partially filled with one of a plurality of pistons attached to a movable stage configured to move the plurality of pistons to completely fill or partially fill the holes. Some embodiments further comprise coating sidewalls of each hole and surfaces of each piston with a material (e.g., TEFLON) configured to minimize adhesion between the sidewalls or surfaces and the solder paste At 504 a remaining portion of each hole that is not filled with one of the plurality of pistons is filled with the solder paste, by applying a force to the front surface of the plate with a solder paste dispenser configured to move across a front surface of the plate. In some embodiments, filling the remaining portions of the holes with the solder paste comprises applying a force to the front surface of the plate with piston of the solder paste dispenser configured to move along a direction orthogonal to the front surface of the plate, which pushes the solder paste into the holes. In some embodiments, excess solder paste is removed from the front surface of the plate with the surface of the solder paste dispenser, prior to disposing the solder paste. Removing the excess solder paste comprises moving the solder paste dispenser along the front surface, such that the solder paste filling the remaining portion of each hole is substantially flush with the front surface of the plate.

At 506 the solder paste is disposed onto a surface of a substrate by moving the movable stage towards the plate, which fills a larger portion of each hole with a piston, forcing the solder paste out of each hole, and forming a pattern of solder paste on the surface of the substrate which corresponds to the pattern of holes within the plate.

In some embodiments, the solder paste is comprised of the alloy powder (e.g., Sb, Cd, In, Bi, Ag, Sn, Zn, etc.), a vehicle system, and a flux system. The vehicle system functions as a carrier for the alloy powder, and as a compatible matrix for the flux system to achieve a desired rheology of the solder paste during a reflow step with or without the optional flux-clean step, resulting in a deformation of the solder paste (108A) into a spherically-shaped solder bump (108B), and adhesion/contact to the UBM (104). The flux system of the solder paste cleans the alloy powder and contacting area (i.e., the UBM) of the solder paste. In some embodiments, the flux system is incorporated into the solder paste. In some embodiments, the flux system is delivered externally in an optional flux step into the solder paste.

In some embodiments, a water-soluble flux system is used so that any residue after soldering can be removed with water. In some embodiments, the solder paste requires no flux step (i.e., no clean). During reflow, the solder paste is preheated to an elevated temperature, and then soaked at a temperature near a melting point of the solder paste, for sufficient time to minimize any temperature gradients within the solder paste. The temperature is then raised above the melting point of the solder paste for a small duration (i.e., about a minute or less), to allow for interaction between the flux system to clean the alloy powder. A cool step follows, as the rate of cooling must account for stresses between the different components of the solder paste to prevent mechanical stress. The reflow results in a deformation of the solder paste into a spherically-shaped solder bump.

Figure 6:
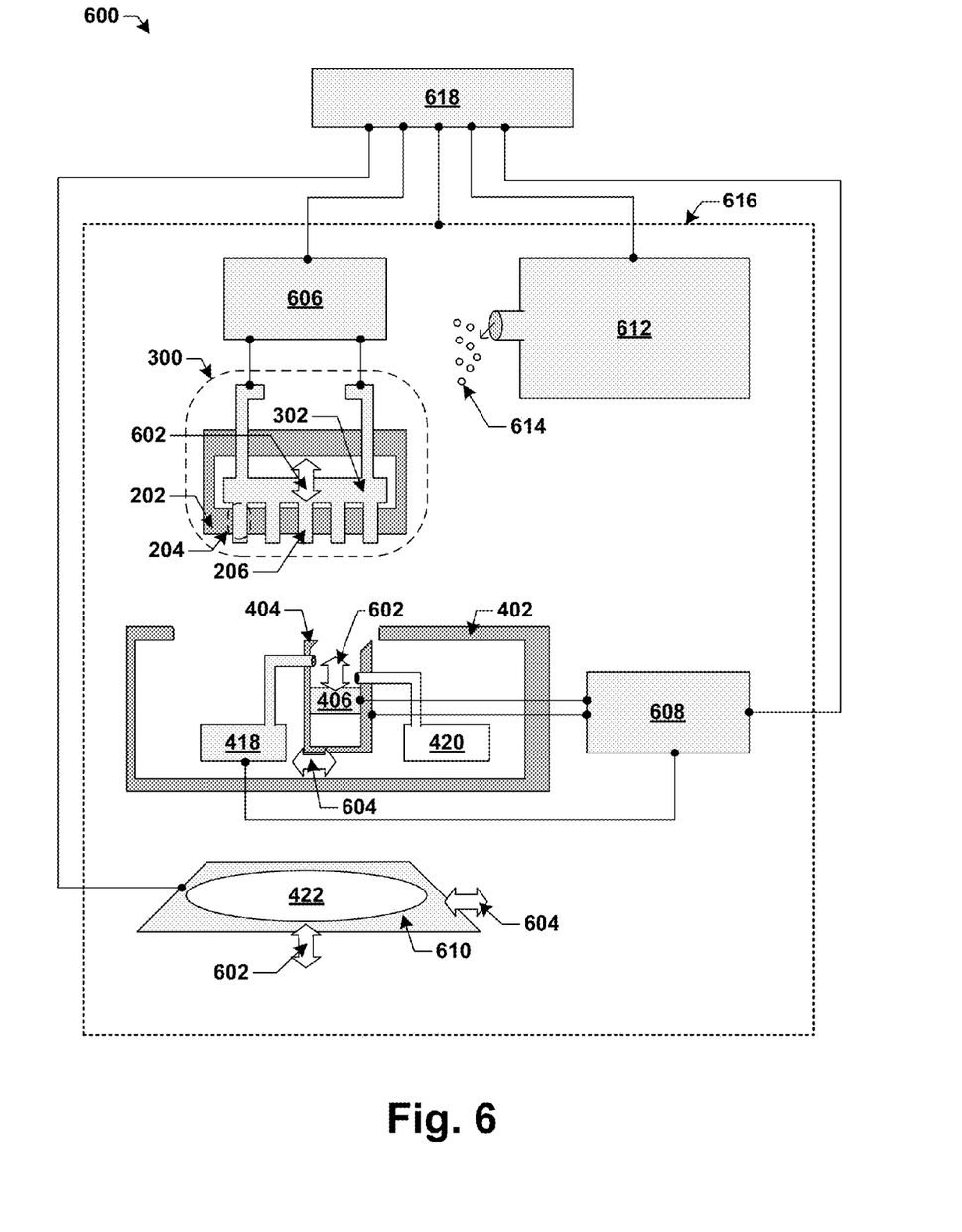
FIG. 6 illustrates some embodiments of a tool arrangement configured to deposit a pattern of solder bumps onto a substrate.

FIG. 6 illustrates some embodiments of a tool arrangement 600 configured to deposit a pattern of solder bumps onto a substrate. The tool arrangement 600 comprises the solder bump deposition tool 300, which comprises a plate 202 comprising a pattern of holes 204, which is aligned with a corresponding pattern of pistons 206, which are attached to a movable stage 302, and configured to move the pattern of pistons along a vertical direction 602 (i.e., the z-direction), to completely or partially fill the pattern of holes 204.

In some embodiments, the patterns of holes 204 and pistons 206 comprise a periodic pattern with a pitch of less than about 150 microns between holes and pistons. In some embodiments, the holes 204 and pistons 206 comprise a width of less than about 100 microns. In some embodiments, the holes 204 and pistons 206 comprise cylindrical shapes. In some embodiments, sidewalls of the holes 204 and surfaces of the pistons 206 are coated with a material configured to minimize adhesion between the sidewalls or surfaces and the solder paste.

In some embodiments, the tool arrangement 600 further comprises a first drive element 606 coupled to the movable stage 302, and configured to move the movable stage 302 along the vertical direction 602, such that the pistons 206 fill the holes 204 or leave a portion of the holes empty.

The tool arrangement 600 further comprises a solder paste application tool 402, comprising a cavity wherein a solder paste dispenser 404 resides. The solder paste dispenser 404 is configured to move across a front surface of the plate in a horizontal direction, fill a respective hole of the pattern of holes, and remove excess solder paste from the front surface.

In some embodiments, the tool arrangement 600 further comprises a second drive element 608, coupled to the solder paste dispenser 404, and configured to move the solder paste dispense 404 across a front surface of the plate. In some embodiments, second drive element 608 is also configured to move a piston 406 within the solder paste dispenser 404 along the vertical direction 602 to push solder paste into the plurality holes 204. In some embodiments, second drive element 608 also controls a vacuum tool 418, coupled to the solder paste dispenser 404, and configured to remove the air and other ambient particles near the front surface of the plate. A supply tool 420, also coupled to the solder paste dispenser 404, provides the solder paste 108A to the dispenser 404.

The tool arrangement 600 further comprises a substrate stage 610 configured to hold a substrate 422, and to move the substrate along the horizontal and vertical directions 604, 602 to align the substrate with the solder bump deposition tool 300.

The tool arrangement 600 further comprises a reflow tool 612 configured to provide a reflow to with or without the optional flux 614 to the substrate 422 after solder paste deposition by the solder bump deposition tool 300. To achieve heating during reflow, the tool arrangement 600 may further comprise an chamber 616 configured to heat the substrate 422. In some embodiments, the chamber 616 comprises a vacuum chamber configured maintain the substrate 422 at low pressure to reduce ambient particles and hence reduce impurities within the solder bumps.

The first and second drive elements 606, 608, substrate stage 610, reflow tool 612, chamber 616 are controlled by a controller 618.

It will also be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein; such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

The present disclosure may repeat reference numerals and/or letters in the various examples. This repetition is for the purpose of simplicity and clarity and does not in itself dictate a relationship between the various embodiments and/or configurations discussed. Moreover, the formation of a first feature on a second feature in the description that follows may include embodiments in which the first and second features are formed in direct contact, and may also include embodiments in which additional features may be formed interposing the first and second features, such that the first and second features may not be in direct contact. As an example, a feature formed on a substrate may include features formed on, above, and/or within the substrate.

Therefore, some embodiments of the present disclosure relate to an apparatus and method to form a pattern of solder bumps. A solder paste is applied a plate comprising a pattern of holes, where each hole is partially filled by a piston attached to a movable stage. The remainder of the holes are filled by applying a force to the solder paste with a solder paste application tool, which pushes the paste into the holes. The solder paste application tool then removes excess paste from the front surface of the plate. The solder paste is then disposed onto a surface of a substrate by moving the movable stage, which fills a larger portion of each hole with a piston, forces the solder paste out of each hole, and forms pattern of solder paste on the surface of the substrate. The pattern of solder paste is then subjected to additional processing to form a pattern of solder bumps. The methods and apparatuses disclosed herein avoid some drawbacks of some prior art approaches such as plating or direct solder paste deposition, which include a photoresist deposition, patterning, and etch to form, as well as plating and striping processes for solder bump formation.

In some embodiments, solder bump deposition tool is disclosed, the solder bump deposition tool comprises a plate comprising a plurality of holes, wherein a hole extends from a front surface to a back surface of the plate, and a movable stage comprising a plurality of pistons, wherein the movable stage is aligned to the plate, such that the pistons partially fill the holes.

In some embodiments, a method of forming a pattern of solder bumps on a surface of a substrate is disclosed. The method comprises applying a solder paste to a front surface of a plate comprising a pattern of holes, wherein each hole is partially filled with one of a plurality of pistons attached to a movable stage configured to move the plurality of pistons to completely fill or partially fill the holes. The method further comprises filling a remaining portion of each hole that is not filled with one of the plurality of pistons with the solder paste, by applying a force to the front surface of the plate with a solder paste dispenser configured to move across a front surface of the plate. The method further comprises disposing solder paste onto a surface of a substrate, by moving the movable stage towards the plate, which fills a larger portion of each hole with a piston, forcing the solder paste out of each hole, and forming a pattern of solder paste on the surface of the substrate which corresponds to the pattern of holes.

In some embodiments, a tool arrangement configured to deposit a pattern of solder bumps onto a substrate is disclosed. The tool arrangement comprises a solder bump deposition tool, comprising a plate comprising a pattern of holes, which is aligned with a corresponding pattern of pistons attached to a movable stage configured to move the pattern of pistons in a vertical direction, to completely or partially fill the pattern of holes. The tool arrangement further comprises a solder paste dispenser configured to move across a front surface of the plate in a horizontal direction, fill a respective hole of the pattern of holes, and remove excess solder paste from the front surface. The sidewalls of the holes and surfaces of the pistons are coated with a material configured to minimize adhesion between the sidewalls or surfaces and the solder paste.

What is claimed is:

1. A solder bump deposition tool, comprising:
 a plate comprising a plurality of holes, wherein a hole extends from a front surface to a back surface of the plate;
 a movable stage comprising a plurality of pistons, wherein the movable stage is aligned to the plate, such that the pistons partially fill the holes; and
 a dispenser configured to move across the front surface, filling the holes with solder paste, and comprising:
  a cavity comprising a first region and a second region, wherein the first region extends along a first axis orthogonal to the front surface, and wherein the second region is arranged between the first region and the front surface, and extends along a second axis angled relative to the first axis; and
  a piston confined to the first region, and configured to move along the first axis to push the solder paste into the holes through the second region, wherein the second region is configured to remove excess solder paste.

2. The solder bump deposition tool of claim 1, wherein sidewalls of the holes and surfaces of the pistons are coated with a material configured to minimize adhesion between the sidewalls or the surfaces, and solder paste.

3. The solder bump deposition tool of claim 2, wherein the material comprises a material containing polytetrafluoroethylene.

4. The solder bump deposition tool of claim 1, wherein the movable stage is configured to move the pistons along a direction orthogonal to the front surface of the plate, such that the pistons fill the holes or leave a portion of the holes empty.

5. The solder bump deposition tool of claim 1, wherein the holes and the pistons comprise a shared, uniform width of less than about 100 microns.

6. The solder bump deposition tool of claim 1, wherein the holes comprise a depth of less than about 1,000 microns.

7. The solder bump deposition tool of claim 1, wherein the holes and the pistons form a periodic pattern with a pitch of less than about 150 microns.

8. The solder bump deposition tool of claim 1, wherein the holes and the pistons comprise cylindrical shapes.

9. The solder bump deposition tool of claim 1, wherein the movable stage comprises a flat front surface, and the plurality of pistons comprise an equal height from the flat front surface.

10. A tool arrangement configured to deposit a pattern of solder bumps onto a substrate, the tool arrangement comprising:
 a solder bump deposition tool comprising a plate, wherein the plate comprises a pattern of holes aligned with a corresponding pattern of pistons attached to a movable stage, and wherein the movable stage is configured to move the pattern of pistons in a vertical direction to completely or partially fill the pattern of holes;
 a solder paste dispenser configured to move across a front surface of the plate in a horizontal direction, fill a hole of the pattern of holes with solder paste, and remove excess solder paste from the front surface;
 a vacuum tool configured to remove air and other ambient particles pushed out of the hole by the solder paste while filling the hole with the solder paste; and a supply tool configured to provide the solder paste to the solder paste dispenser while the solder paste dispenser moves across the front surface;

wherein sidewalls of the holes and surfaces of the pistons are coated with a material configured to minimize adhesion between the sidewalls or the surfaces, and the solder paste.

11. The tool arrangement of claim 10, further comprising:
a first drive element coupled to the movable stage, and configured to move the movable stage along the vertical direction, such that the pistons fill the holes or leave a portion of the holes empty.

12. The tool arrangement of claim 10, further comprising a second drive element coupled to the solder paste dispenser and configured to:
move the solder paste dispenser across the front surface of the plate; and
move a piston within the solder paste dispenser along a direction orthogonal to the front surface of the plate to push the solder paste into the pattern of holes.

13. The solder bump deposition tool of claim 1, further comprising:
a vacuum tool configured to remove air and other ambient particles pushed out of the holes by the solder paste while filling the holes with the solder paste; and
a supply tool configured to provide the solder paste to the dispenser while the dispenser moves across the front surface.

14. A tool arrangement comprising:
a solder bump deposition tool configured to deposit solder paste on a substrate, and comprising a plate and a movable stage, wherein the plate comprises a pattern of holes extending between opposing front and back surfaces of the plate, wherein the movable stage is arranged along the back surface of the plate, wherein the movable stage comprises a pattern of pistons corresponding to and aligned to the pattern of holes, wherein the movable stage is configured to move the pattern of pistons within the holes, and wherein the pistons have individual widths substantially equal to individual widths of the holes;
a solder paste application tool comprising a solder paste dispenser arranged in a cavity, wherein the solder paste dispenser is configured to move laterally within the cavity across the front surface of the plate, to fill the holes with the solder paste, and to remove excess solder paste; and a substrate stage configured to hold the substrate and to move the substrate relative to the solder bump deposition tool to align the substrate to the pattern of holes;

wherein the solder bump deposition tool is external to the cavity, and is configured to move vertically to an opening to the cavity to fill the holes with the solder paste.

15. The tool arrangement of claim 14, wherein sidewalls of the holes and of the pistons are coated with a material configured to minimize adhesion of the solder paste to the sidewalls.

16. The tool arrangement of claim 14, wherein the holes and the pistons comprise a shared, uniform width of less than about 100 microns.

17. The tool arrangement of claim 14, wherein the holes and the pistons form periodic patterns with a shared pitch of less than about 150 microns.

18. The solder bump deposition tool of claim 1, further comprising:
a vacuum tool configured to remove air and other ambient particles pushed out of the holes by the solder paste while filling the holes with the solder paste; and
a supply tool configured to provide the solder paste to the dispenser while the dispenser moves across the front surface.

19. The tool arrangement of claim 10, wherein the solder paste dispenser comprises:
a cavity comprising a first region and a second region, wherein the first region extends along a first axis orthogonal to the front surface, and wherein the second region is arranged between the first region and the front surface, and extends along a second axis angled relative to the first axis; and
a piston confined to the first region, and configured to move along the first axis to push the solder paste into the hole through the second region, wherein the second region is configured to remove excess solder paste.

20. The tool arrangement of claim 14, wherein the solder paste application tool further comprises:
a vacuum tool configured to remove air and other ambient particles pushed out of the hole by the solder paste while filling the holes with the solder paste; and
a supply tool configured to provide the solder paste to the solder paste dispenser while the solder paste dispenser moves across the front surface.

* * * * *